(12) United States Patent
Perkins, II

(10) Patent No.: US 7,871,170 B2
(45) Date of Patent: Jan. 18, 2011

(54) PROTECTIVE VISOR FOR MARINE ELECTRONICS

(75) Inventor: Paul Simon Perkins, II, Downers Grove, IL (US)

(73) Assignee: Raptor Fishing Technologies, Inc., Downers Grove, IL (US)

(*) Notice: Subject to any disclaimer, the term of this patent is extended or adjusted under 35 U.S.C. 154(b) by 0 days.

(21) Appl. No.: 12/358,223

(22) Filed: Jan. 22, 2009

(65) Prior Publication Data

US 2009/0219621 A1 Sep. 3, 2009

Related U.S. Application Data

(63) Continuation of application No. 11/656,901, filed on Jan. 23, 2007, now abandoned.

(60) Provisional application No. 60/761,494, filed on Jan. 24, 2006.

(51) Int. Cl.
G02B 27/00 (2006.01)
G02B 21/00 (2006.01)

(52) U.S. Cl. .................. 359/609; 359/601; 359/612

(58) Field of Classification Search .............. 359/601, 359/608–612; 348/834, 842
See application file for complete search history.

(56) References Cited

U.S. PATENT DOCUMENTS

| 4,784,468 | A | * | 11/1988 | Tierney | 359/601 |
| D337,591 | S | * | 7/1993 | Buhyoff | D14/239 |
| 5,237,453 | A | * | 8/1993 | Jones | 359/601 |
| 5,528,424 | A | * | 6/1996 | Lentz et al. | 359/612 |
| 5,966,241 | A | * | 10/1999 | Gilger | 359/609 |

* cited by examiner

*Primary Examiner*—Thong Nguyen
(74) *Attorney, Agent, or Firm*—Erickson Law Group, PC

(57) ABSTRACT

A visor shield for shielding a marine electronic device from sunlight, weather and spray includes a visor body having a base portion for attachment to an electronic device, and a protruding portion extending from the base portion and sized to extend out from the electronic device to shade a front face of the electronic device. The base portion and the protruding portion can be formed of a unitary plastic part. The base portion can comprise a wall continuous with the protruding portion. A compressible seal can be attached to a surface of the wall and arranged to be compressed against a housing of the electronic device when the base portion is attached to the electronic device.

8 Claims, 2 Drawing Sheets

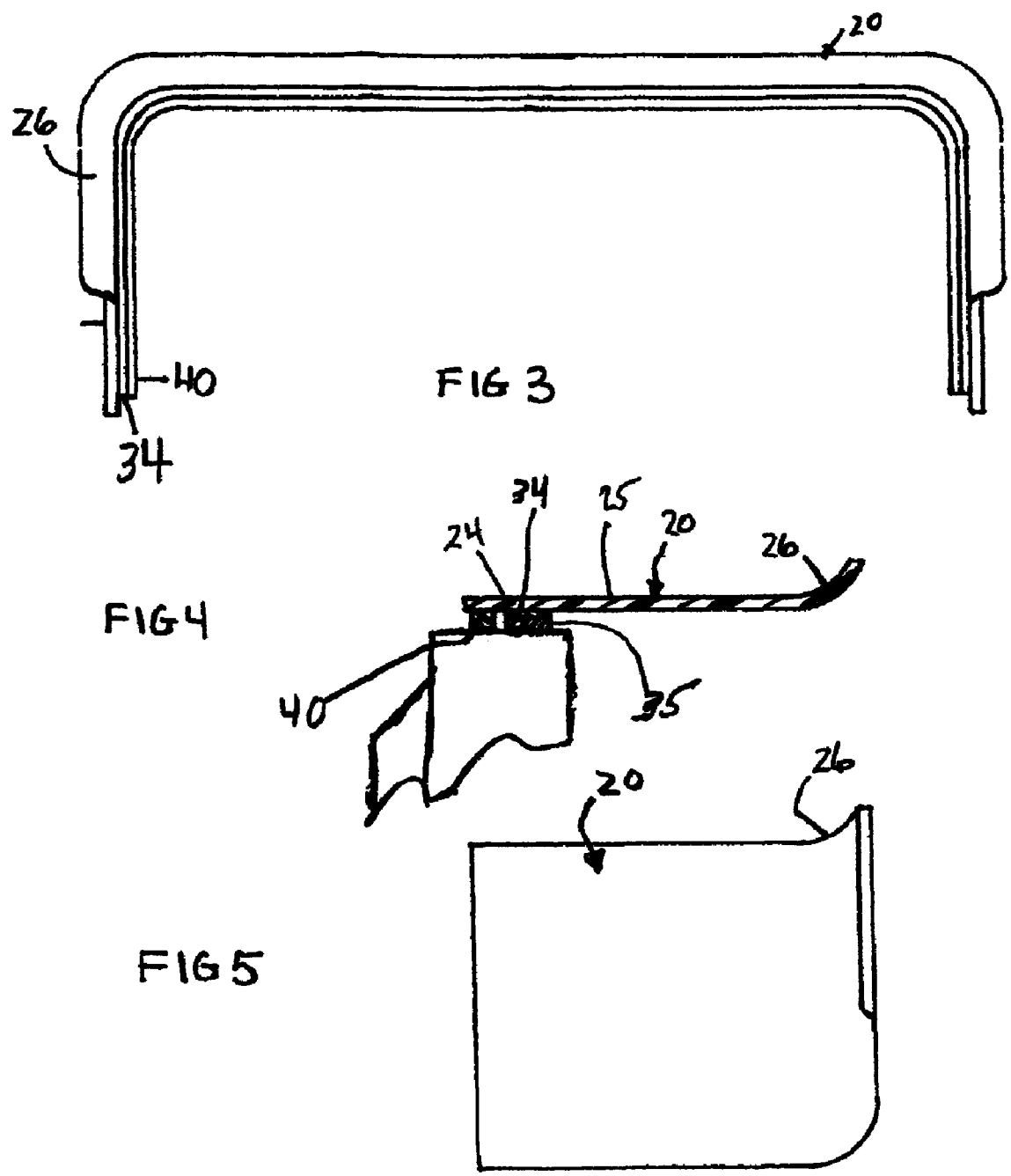

PROTECTIVE VISOR FOR MARINE ELECTRONICS

This application is a continuation of U.S. patent application Ser. No. 11/656,901 filed on Jan. 23, 2007, now abandoned, and which claims the benefit of U.S. provisional patent application Ser. No. 60/761,494 filed Jan. 24, 2006.

BACKGROUND OF THE INVENTION

Marine electronics with display screens, for example, depth sounders, fish locators, global positioning satellite (GPS) systems, chart plotters, navigation displays, or radar displays, are difficult to view in direct sunlight.

Also, prolonged ultraviolet light (UV) and weather exposure can deteriorate the electronic device.

Also, when a boat is under forward power, with the electronic device facing the driver, rain and sea spray can accumulate on the screen making viewing difficult.

Hinged visors have been used to shield glare and ultraviolet light from laptop computers. The hinge design is not applicable for outdoor use when weather protection is needed.

Glare reduction filters are available for liquid crystal diode (LCD) screens. The benefits of the screen are reduced when viewed through polarized lenses. Polarized sunglasses are commonly worn during marine use.

The present inventor has recognized the need for a device to protect electronic devices used on boats or other marine equipment, particularly a device that protects displays and controls from ambient conditions.

SUMMARY OF THE INVENTION

The present invention provides a protective visor to protect electronic devices from weather and other ambient conditions. The present invention provides a protective visor that reduces glare on display screens of electronic devices. The present invention provides a protective visor that reduces ultraviolet exposure to keypads and display screens of electronic devices. The present invention provides a protective visor that protects the view of a display screen of electronic devices against rain or water spray condition when the boat is under forward power. The present invention provides a protective visor that is adaptable to be removable or permanently attached.

According to a preferred embodiment, a visor shield for a marine electronic device includes a visor body having a base portion for attachment to an electronic device, and a protruding portion extending from the base portion and sized to extend out from the electronic device to shade a front face of the electronic device. The base portion and the protruding portion can be formed of a unitary plastic part. The base portion can comprise a wall continuous with the protruding portion. A compressible seal can be attached to a surface of the wall and arranged to be compressed against a housing of the electronic device when the base portion is attached to the electronic device.

The base portion and the protruding portion comprise a U-shaped cross-section. A removable attachment can be arranged between the base portion and the electronic device. The removable attachment can be a hook strip configured to be applied to one of the electronic device and the base portion, and a corresponding loop strip configured to be applied to the respective other of the electronic device and the base portion.

Numerous other advantages and features of the present invention will be become readily apparent from the following detailed description of the invention and the embodiments thereof, and from the accompanying drawings.

BRIEF DESCRIPTION OF THE DRAWINGS

FIG. 3 is about view of the protective visor of FIG. 1;

FIG. 4 is a cross sectional view of the protective visor taken generally along line 4-4 of FIG. 1; and FIG. 5 is a right side view of the protective visor of FIG. 1.

DETAILED DESCRIPTION OF THE PREFERRED EMBODIMENT

Figure 1:
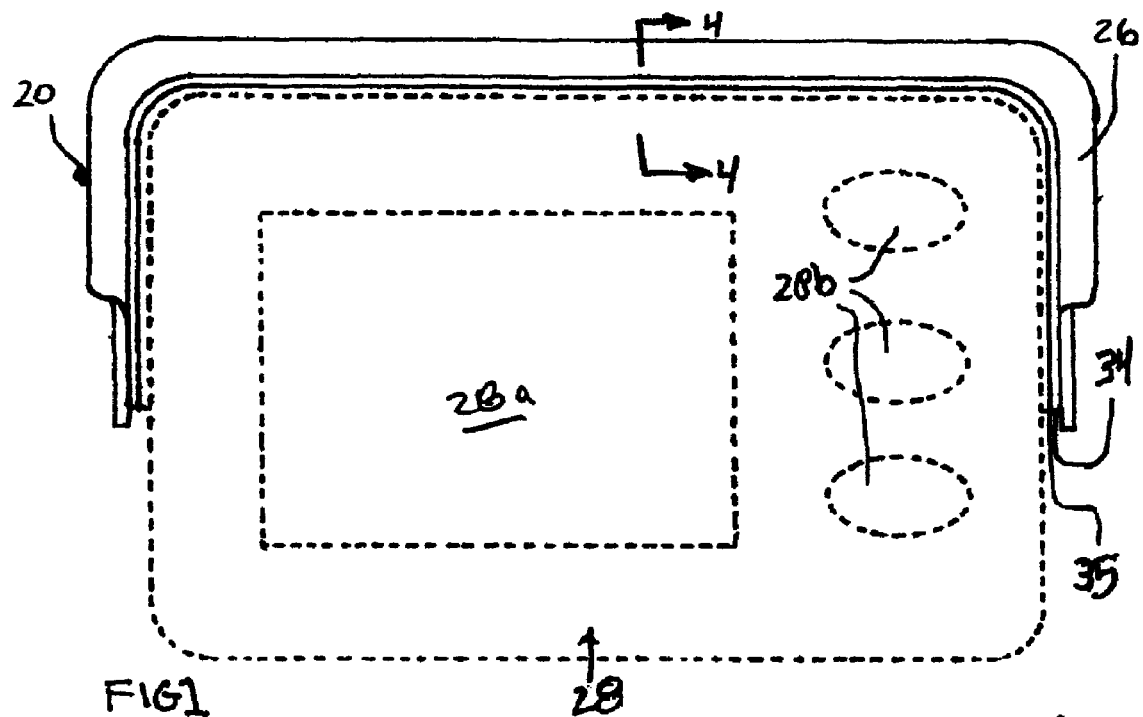
FIG. 1 is a front elevational view of a protective visor of the present invention mounted on an electronic device.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

Figure 2:
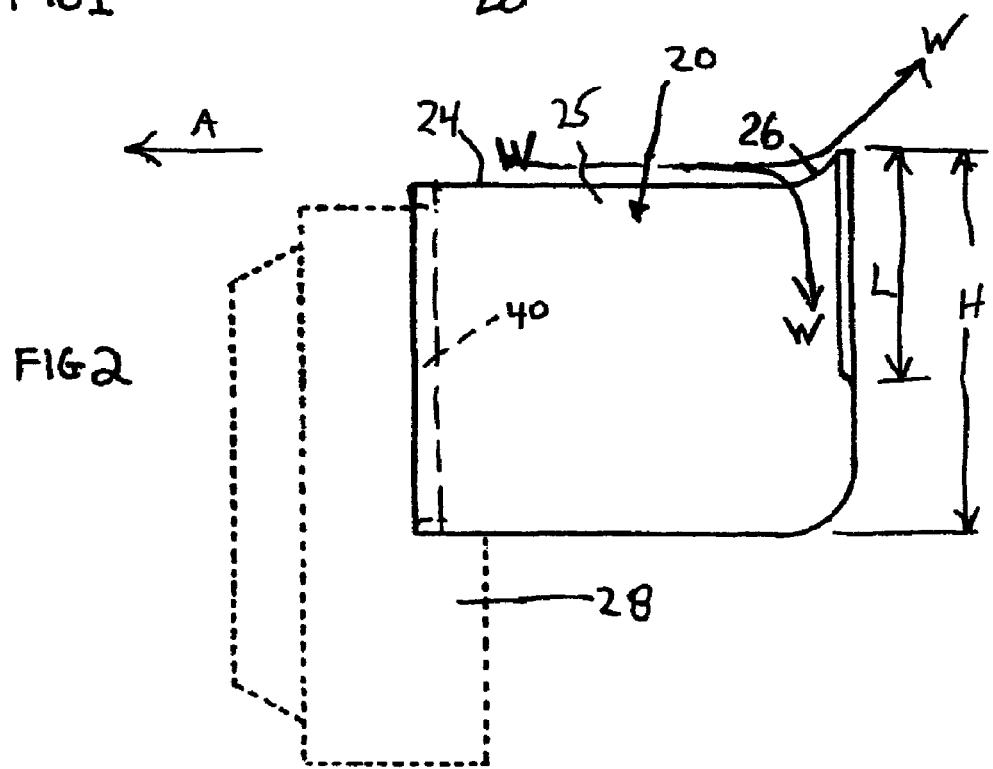
FIG. 2 is a right side view of the visor of FIG. 1 mounted on an electronic device.

FIGS. 1 and 2 show a visor shield 20. Preferably, the visor shield 20 is composed of a unitary piece of plastic material, such as KYDEX® T thermoplastic sheeting, available from Kleerdex Company, LLC of Bloomsburg, Pa., USA. Alternately, acrylonitrile butadiene styrene (ABS) or polyvinyl chloride (PVC) plastic materials could be used. Preferably, the shield 20 includes a base portion 24 and a protruding portion 25 including a turn-up facing edge or turned out portion 26. As shown in FIG. 2, the base portion overlaps a typical marine electronic device 28. The protruding portion 25 extends forwardly from front edge of the electronic device 28. The protruding portion 25 comprises a first portion extending from front edge of the electronic device 28 to the turn-up facing edge or turned out portion 26. The edge 26 extends across a top of the shield, and on opposite sides for a length L which is one half to two thirds of a height H of the visor shield 20. The visor shield 20 is shown mounted to [[a]] the typical marine electronic device 28, having a display screen 28a and controls 28b. The base portion 24 of the visor shield 20 closely fits over a portion of the electronic device 28 and is configured for attachment thereto. The visor shield 20 is attached to the electronic device 28 by removable attachments 34, 35. Preferably, the removable attachments comprise hook and loop surface attachment components. For example, a strip of hooks 34 could be attached to the visor shields 20 and a strip of loops 35 could be attached to the electronic device 28, or vice versa. The strips 34, 35 could be permanently attached to the respective component 20, 28 and the interface between the strips 34, 35 can be made removable by forcibly breaking the grip between the hooks and loops.

Alternatively, the visor shield 20 can be fastened to the electronic device 28 or adhesively secured thereto.

As illustrated in FIG. 2, when a marine craft is propelled through the water in the direction A, sea spray or precipitation is driven against a backside of the electronic device and visor shield 20 in the direction W. The turned edge 26 directs the water away from the electronic device on one or more water flow paths as shown by direction W, either outwardly or downwardly.

As shown in FIGS. 3 and 4, a compressible weather resistant gasket 40 runs continuously along an edge of the base portion 24 of the visor shield 20. The gasket 40 prevents water from seeping between the visor shield 20 and the electronic device. Preferably, the gasket is a ³⁄₁₆" height, adhesive backed neoprene/EPDM/SBR foam rubber strip.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A visor shield for a marine electronic device in a marine application, comprising:
   a visor body having a base portion for attachment to an electronic device, and a protruding portion extending from said base portion and sized to extend out from the electronic device to shade a front face of said electronic device; the visor has a top portion, side portions, and an open bottom opposite the top portion;
   said protruding portion comprising a first portion and a turned-out portion adjacent to an end of said first portion opposite said base portion,
   the turned-out portion defines at least a first and second water flow paths of the visor when water is directed onto the visor in said marine application, the first flow path extends along a portion of the visor and directs water outward over an outer edge of the turned-out portion; the second flow path extends along a portion of the top portion and downwardly along a portion of the turned-out portion of the side portion, wherein the turned-out portion along the side portion is angled to prevent at least some water from traveling outwardly over the outer edge of the turned-out portion when water is directed onto the visor in said marine application;
   at least one portion of the turned out portion is not co-planer with the base portion.

2. The visor shield according to claim 1, wherein said base portion and said protruding portion comprises a unitary plastic part, and said base portion comprises a wall continuous with said protruding portion, and comprising a compressible seal attached to a surface of said wall and arranged to be compressed against a housing of said electronic device when said base portion is attached to said electronic device.

3. The visor shield according to claim 2, wherein said base portion and said protruding portion comprise a U-shaped cross-section.

4. The visor shield according to claim 3, comprising a removable attachment arranged between said base portion and said electronic device.

5. The visor shield according to claim 4, wherein said removable attachment comprises a hook strip configured to be applied to one of said electronic device and said base portion, and a corresponding loop strip configured to be applied to the respective other of said electronic device and said base portion.

6. The visor shield according to claim 1, wherein said base portion and said protruding portion are smoothly continuous and comprise a U-shaped cross-section.

7. The visor shield according to claim 1, comprising a removable attachment arranged between said base portion and said electronic device.

8. The visor shield according to claim 7, wherein said removable attachment comprises a hook strip configured to be applied to one of said electronic device and said base portion, and a corresponding loop strip configured to be applied to the respective other of said electronic device and said base portion.

* * * * *